United States Patent
Beer et al.

(10) Patent No.: US 7,915,082 B2
(45) Date of Patent: Mar. 29, 2011

(54) SEMICONDUCTOR DEVICE

(75) Inventors: Gottfried Beer, Nittendorf (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 238 days.

(21) Appl. No.: 12/256,646

(22) Filed: Oct. 23, 2008

(65) Prior Publication Data
US 2010/0102422 A1    Apr. 29, 2010

(51) Int. Cl.
H01L 21/20    (2006.01)

(52) U.S. Cl. ........ 438/109; 438/118; 438/125; 438/455; 438/460; 438/465; 257/E21.499; 257/E21.505; 257/E23.018; 257/E31.011

(58) Field of Classification Search .......... 438/109–125, 438/455–465, 613, 781; 257/E21.499–505, 257/23.018, 31.011
See application file for complete search history.

(56) References Cited

U.S. PATENT DOCUMENTS

| | | | |
|---|---|---|---|
| 5,353,498 A | | 10/1994 | Fillion et al. |
| 6,261,927 B1 * | | 7/2001 | Natarajan et al. ............. 438/455 |
| 6,669,801 B2 * | | 12/2003 | Yoshimura et al. ........... 156/230 |
| 7,101,617 B2 * | | 9/2006 | Cavallaro et al. ............. 428/331 |
| 7,528,004 B2 * | | 5/2009 | Torii ................................ 438/99 |
| 2003/0215056 A1 * | | 11/2003 | Vuorela ........................... 378/62 |
| 2005/0087861 A1 * | | 4/2005 | Burtzlaff et al. .............. 257/704 |
| 2005/0095835 A1 * | | 5/2005 | Humpston et al. ............ 438/613 |
| 2007/0096311 A1 * | | 5/2007 | Humpston et al. ............ 257/734 |
| 2007/0096312 A1 * | | 5/2007 | Humpston et al. ............ 257/734 |
| 2008/0001241 A1 * | | 1/2008 | Tuckerman et al. .......... 257/434 |
| 2008/0029879 A1 * | | 2/2008 | Tuckerman et al. .......... 257/704 |

OTHER PUBLICATIONS

"Etch and Plating Resist Formation by Hot Melt Ink Jet," SunChemical, Nigel Cagler, Sep. 2007, (16 pages).
"An Embedded Device Technology Based on a Molded Reconfigured Wafer," Electronic Components and Technology Conference, 2006. Proceedings. 56th Volume, May 30, 2006, (5 pages).

* cited by examiner

Primary Examiner — Michael S Lebentritt (74) Attorney, Agent, or Firm — Dicke, Billig & Czaja, PLLC (57) ABSTRACT

A method of fabricating a semiconductor device includes depositing a mask of low melting point material on a surface of the semiconductor device; depositing a layer to be structured relative to the mask; and removing the mask of low melting point material.

22 Claims, 10 Drawing Sheets

SEMICONDUCTOR DEVICE

BACKGROUND

Semiconductor chips include contact pads on one or more surfaces. Semiconductor packages include one or more of the chips encapsulated in an insulating material. Electrical connections are made to the contact pads of the chip to electrically connect the semiconductor package.

The contact pads of the chips are generally small. For example, some contact pads are square having a side dimension of about 60 micrometers. It is time consuming (and thus expensive) to accurately form through-holes (or vias) that communicate with the contact pads when making Z-direction electrical connections in the semiconductor package.

For these and other reasons there is a need for the present invention.

SUMMARY

One embodiment provides a method of fabricating a semiconductor device. The method includes depositing a mask of low melting point material on a surface of the semiconductor device; depositing a layer to be structured relative to the mask; and removing the mask of low melting point material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In this specification, "low melting point material" means a material that melts at a temperature of less than 110, typically around approximately 90 degrees Celsius.

In this specification, "residue" means a small amount of material, the amount being measured in molecules and not in grams. For example, a wax residue is measured by a chromatographic instrument that is sufficiently sensitive to detect one or more molecules of the wax.

Figure 1A:
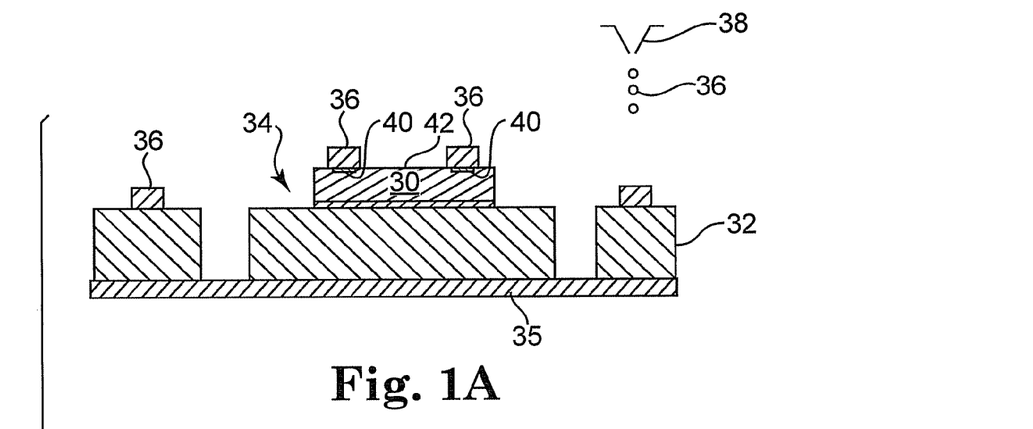
FIGS. 1A-1C illustrate the fabrication of a semiconductor device according to one embodiment.
Figure 1B:
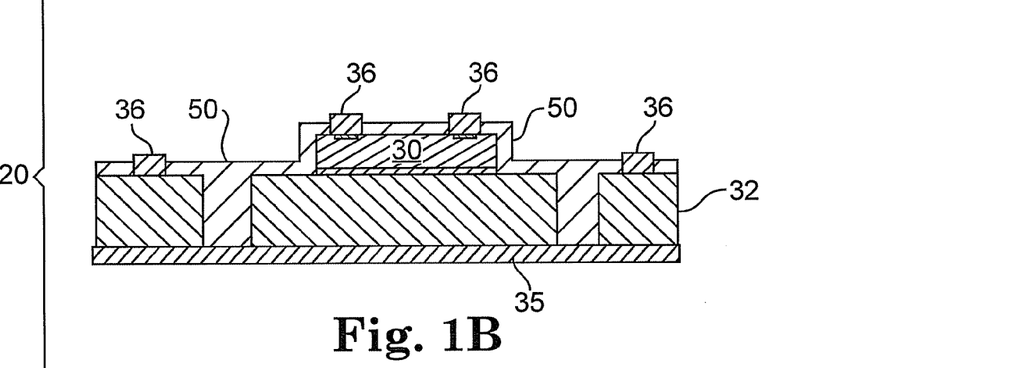
Figure 1C:
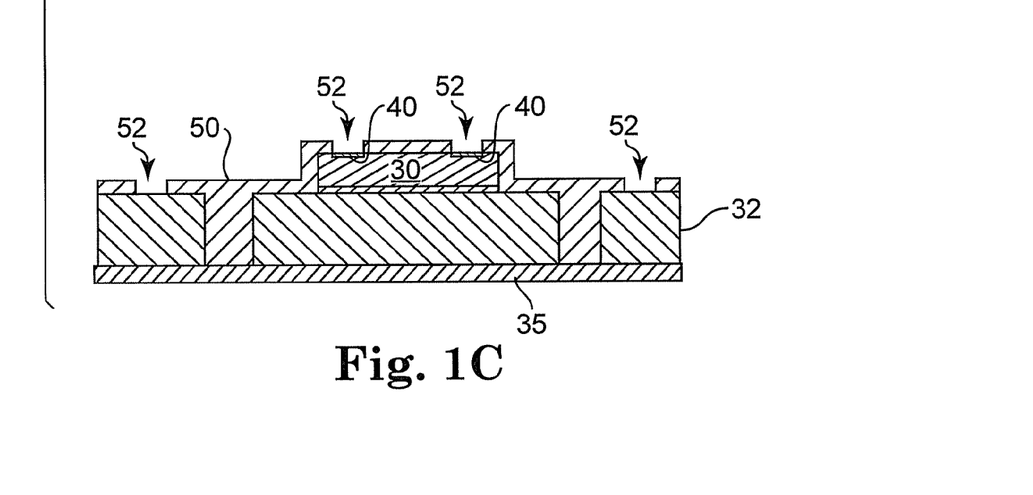

FIGS. 1A-1C illustrate cross-sectional views of various embodiments of a processes 20 for fabricating a semiconductor device. A semiconductor chip 30 is attached to a carrier 32 to define a semiconductor device 34, and a low melting point material 36 (material 36) is deposited on one or more surface of semiconductor device 34.

In one embodiment, material 36 is deposited onto a surface of chip 30 and/or a surface of carrier 32. For example, in one embodiment contact pads 40 on an active surface 42 of chip 30 and a portion of a conductive carrier 32 are covered with material 36. In one embodiment, material 36 is heated within a reservoir (not shown) or within a print head 38 to provide liquid droplets of material 36 that are directed toward semiconductor device 34. In one embodiment, material 36 is deposited or sprayed in volumes in the order of Pico-liters such that the small mass of material 36 solidifies upon contact the surfaces of semiconductor device 34.

In one embodiment, material 36 is deposited by multiple heads 38, for example by an 8×256 unit array of ink jet print heads 38 that enable high production speeds with high accuracy. In one embodiment, the 8×256 unit array of ink jet print heads 38 is guided by software files to enable repositionable accuracy as material 36 is deposited on subsequent semiconductor device intermediates. The 8×256 unit array of inkjet print heads 38 provides a "drops-on-demand" process that does not physically touch or alter the semiconductor device intermediate with a tool, such that topographical dimensions in the Z-direction of about 1500 micrometers are achievable. In one embodiment, and in combination with a pattern recognition system, an actual bitmap location of a deposition pattern for material 36 is measured/sensed and stored in an optimal dedicated printing file to be printed by the array of print heads 38.

Other processes for depositing material 36 on device 34 are also acceptable, including printing, ink jet printing, screen printing, flex printing, spraying or other deposition processes. Jet printing of material 36 enables accurate dimensional control of features printed on semiconductor device 34.

FIG. 1B is a cross-sectional view of material 36 deposited along discrete locations of chip 30 and carrier 32 and a layer 50 to be structured that is deposited adjacent to material 36. In one embodiment, layer 50 is a dielectric material that is structured relative to chip 30 and carrier 32 and deposited around material 36.

FIG. 1C is a cross-sectional view of layer 50 structured to include vias 52 or through-holes 52. Vias 52 communicate through layer 50 to expose contact pads 40 on chip 30 and contact areas on carrier 32. In one embodiment, low melting point material 36 has a melting point of less than approximately 90 degrees Celsius such that when semiconductor device 34 is heated above 90 degrees Celsius material 36 melts to a liquid and is easily removed from contact pads 40 and carrier 32. In one embodiment, melted material 36 is removed with an air knife, washing, or other suitable processes for removing melted (e.g., liquid) material.

In one embodiment, low melting point material 36 is a hydrocarbon wax or ester of fatty acid that is generally insoluble in water but soluble in non-polar organic solvents. In one embodiment, the wax is a long chain fatty acid wax with a melting point of about 70 degrees Celsius. In one embodiment, low melting point material 36 is a polymer material, such as a thermoplastic, with a melting point of less than 90 degrees Celsius. Suitable low melting point thermoplastic materials include polyethylene, ethylene vinyl acetate, or other low melting point plastics such as polymorph.

In one embodiment, the vias 52 include side walls that communicate with contacts 40 of chip 30 and contact areas on carrier 32, and when material 36 is removed from semiconductor device 34, a residue of material 36 remains on one or more walls of vias 52. In this manner, one is able to detect a residue of material 36 with an analytical device such as a chromatograph or other molecular analyzing machine to identify that most of material 36 was removed to form vias 52.

In one embodiment, process 20 includes an additive process in which layer 50 to be structured is deposited laterally adjacent to material 36 but not over contacts 40. In this manner, process 20 provides a semi-additive process in which layers are sequentially added prior to removing low melting point material 36 to reveal a layer that has been structured on semiconductor device 34.

Figure 2:
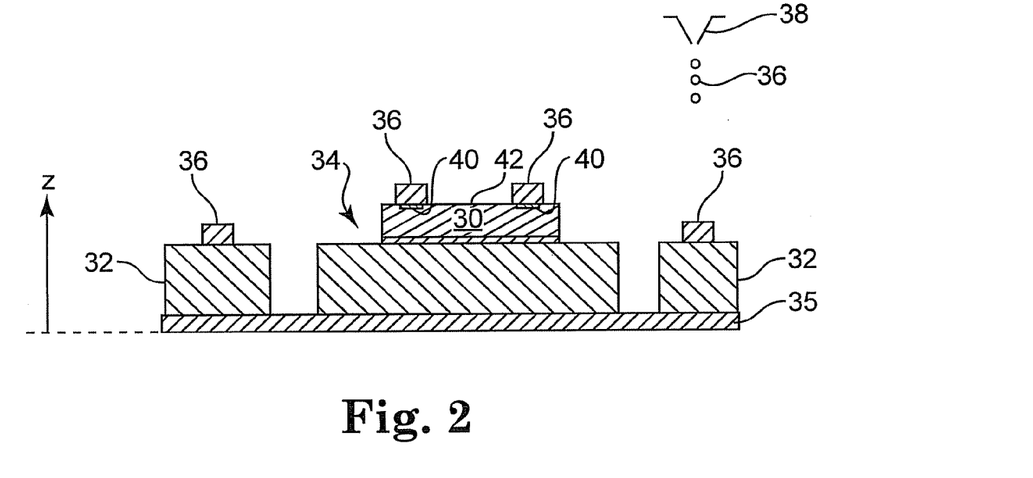
FIG. 2 is a cross-sectional view of a low melting point material jet printed onto a surface of a semiconductor device according to on embodiment.

FIG. 2 is a cross-sectional view of semiconductor device 34 mounted to temporary a support 35. Semiconductor device 34 includes one or more semiconductor chips 30 mounted to carrier 32.

Semiconductor chips 30 include integrated circuits suitably configured as logic circuits, control circuits, microprocessors, or microelectrical-mechanical components. In one embodiment, chips 30 include power semiconductor chips such as power transistors, power diodes, insulated gate bipolar transistors (IGBT), etc. In one embodiment, chips 30 include a vertical structure (a Z-directional structure) configured such that electric current flows in the Z-direction perpendicular to the main surfaces of semiconductor device 34. In one embodiment, suitable semiconductor chips 30 are provided with a Z-direction topography and include chips 30 having contacts 40 on active surface 42 and on or more opposing contacts on a bottom side attached to carrier 32. In one embodiment the device 34 includes passive devices e.g. capacitors, resistors and/or inductors and/or additional already housed semiconductor devices. In one embodiment the device 34 includes a battery or/and energy harvesting device. In one embodiment the device 34 includes an antenna and/or input keys and/or output actuators (e.g. buzzer) and/or optical units (e.g. LED, display). In one embodiment the device 34 includes a connector for external connections.

In one embodiment, carrier 32 includes a substrate such as a laminated substrate, a flex substrate, a ceramic substrate, or a silicon substrate. In one embodiment, carrier 32 includes an electrically conductive carrier such as a metal leadframe. Suitable leadframes include leaded leadframes or non-leaded leadframes. Suitably leaded leadframes include thin outline leadframes, dual inline package leadframes, quad flat package leadframes, and the like. Suitable non-leaded leadframes include very thin outline quad flat non-leaded leadframes or thin outline leadless packages.

In one embodiment, temporary support 35 is a reusable temporary support such as a metal disc configured to support a wafer fabricated to include multiple semiconductor devices 34.

Figure 3:
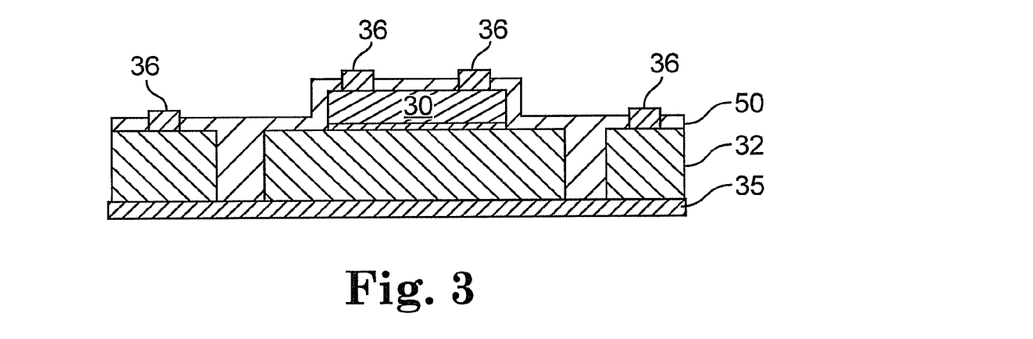
FIG. 3 is a cross-sectional view of the semiconductor device illustrated in FIG. 2 including a layer to be structured deposited adjacent to the low melting point material.

FIG. 3 is a cross-sectional view of semiconductor device 34 intermediate illustrated in FIG. 2 including layer 50. In one embodiment, layer 50 provides a layer to be structured and is deposited alongside and adjacent to low melting point material 36.

In one embodiment, layer 50 includes insulating material such as polymer material or an inorganic material such as silicon oxide, silicon nitride, oxynitride, low-k dielectric material (a dielectric material with a smaller dielectric constant than silicon dioxide), high-k dielectric material (a dielectric material with a higher dielectric constant than silicon dioxide), or ferroelectric material. In one embodiment, layer 50 is an insulating polymeric material employed to provide thin film insulating layers for electrical interconnects or wiring to semiconductor device 34. In one embodiment, insulating inorganic materials are employed as hard passivation layers or dielectrics of capacitors embedded in the electrical interconnects or wiring of semiconductor device 34.

In one embodiment, layer 50 is structured of layers of different materials. For example, in one embodiment layer 50 is a multi-layer structure. In one embodiment, layer 50 is an electrically conductive layer. Layer 50 is suitably fabricated to any desired geometric shape and from any suitable material composition. Suitable electrically conductive materials for layer 50 include aluminum, gold, copper, metal alloys, organic conductors or other suitable materials. When layer 50 is provided as an electrically conductive layer, it need not be a homogenous material, and can include layer stacks, compositions, concentrations, blends, mixtures, or solutions of materials.

In one exemplary embodiment, layer 50 is deposited in a suitable deposition process to provide a dielectric layer adjacent to material 36. One suitable deposition process includes a chemical vapor deposition process.

In one embodiment, layer 50 is pre-cured at a temperature of less than 70 degrees Celsius, which can be done either before or after removal of material 36. For example, in one embodiment layer 50 is a dielectric layer that is pre-cured to harden layer 50. It is desirable to cure layer 50 at a temperature that will not melt material 36. In one embodiment, layer 50 is cured or pre-cured at a temperature of less than about 70 degrees Celsius. Curing layer 50 hardens layer 50 and configures layer 50 for subsequent processing. In one embodiment, layer 50 is pre-cured with ultraviolet light.

Figure 4:
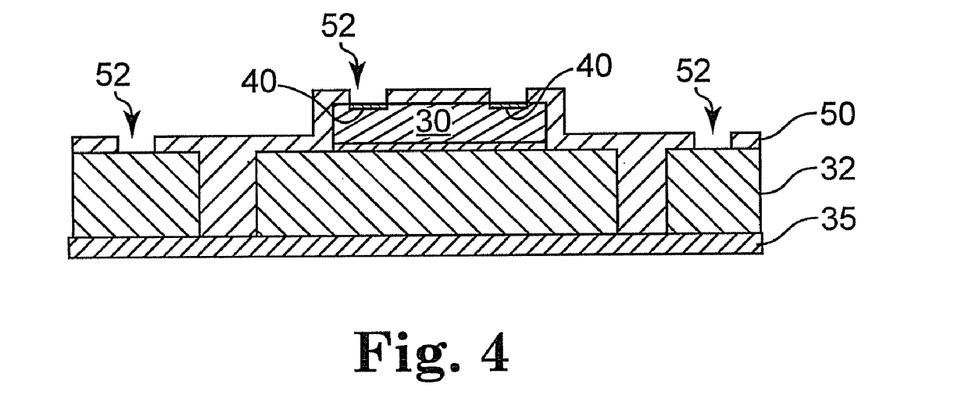
FIG. 4 is a cross-sectional view of the semiconductor device intermediate illustrated in FIG. 3 after removal of the low melting point material according to one embodiment.

FIG. 4 is a cross-sectional view of semiconductor device 34 intermediate (FIG. 3) with material 36 removed to define vias 52. Vias 52 communicate through layer 50 to "open" contacts 40. In one embodiment, material 36 is removed by heating at least layer 50 to a temperature greater than e.g. 90 degrees Celsius to melt layer 36. In one embodiment, melted layer 36 is removed with an air jet. In other embodiments, melted layer 36 is washed from layer 50. After removal of layer 36, vias 52 are formed in layer 50 to provide openings communicating with carrier 32 and contacts 40 formed on chip 30.

Figure 5:
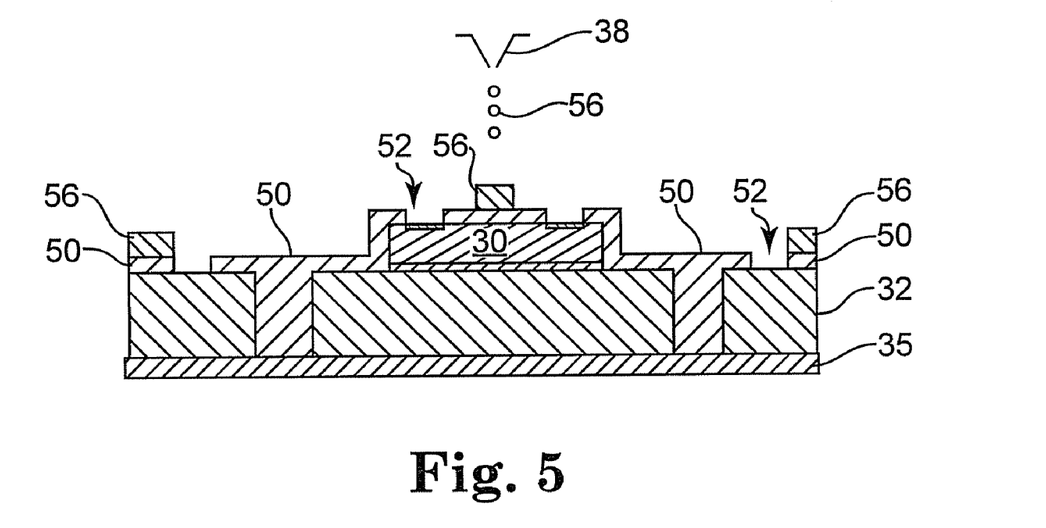
FIG. 5 is a cross-sectional view of the semiconductor device intermediate illustrated in FIG. 4 including additional low melting point material jet printed onto the dielectric layer according to one embodiment.

FIG. 5 is a cross-sectional view of head 38 employed to deposit additional low melting point material 56 onto selected, discrete locations of layer 50 according to one embodiment. In one embodiment, additional low melting point material 56 is deposited from head 38 on top of layer 50 to structure a Z-directional topography above carrier 32 and/or chip/devices 30. Additional low melting point material 56 is similar to material 36 and includes waxes or plastics having a melting point of less than 110 degrees Celsius, preferably less than 90 degree Celsius.

In one embodiment, contact pads 40 have a lateral dimension between approximately 20-60 micrometers and material 36 is deposited with a lateral tolerance of a few micrometers onto pads 40.

Figure 6:
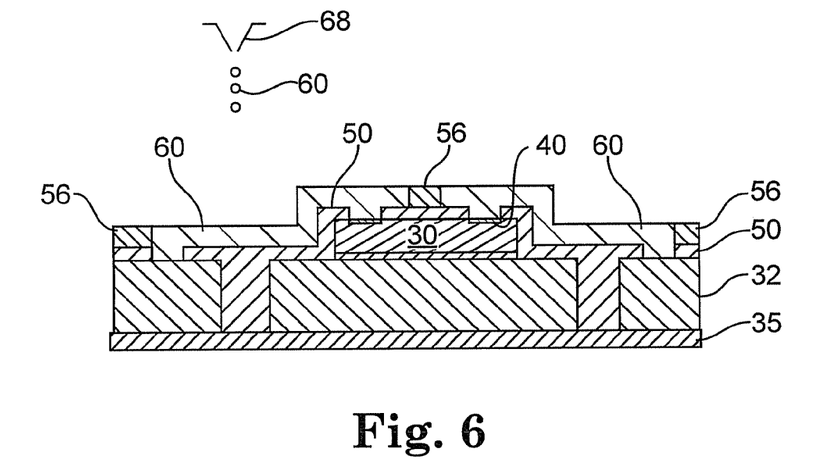
FIG. 6 is a cross-sectional view of the semiconductor device intermediate illustrated in FIG. 5 including conductive material deposited adjacent to the additional low melting point material to form a redistribution layer according to one embodiment.

FIG. 6 is a cross-sectional view of an electrically conducting layer 60 deposited adjacent to low melting point material 56. In one embodiment, electrically conducting layer 60 is jet printed from a head 68 in a temperature range that is compatible with low melting point material 56. Other suitable deposition processes for electrically conducting layer 60 are also acceptable. Suitable such processes include e.g. screen printing (the low melting point material 56 acts itself as a screen), chemical vapor deposition processes, physical vapor deposition processes, chemical or electrochemical plating processes or a combination there of.

In one embodiment a seed layer (not depicted) is applied before the low melting point material 56 is deposited. Then metal layer is deposited adjacent to the low melting point material 56 preferable by electro chemical plating. The seed layer is etched off after the low melting point material is stripped off.

In one embodiment, electrically conducting layer 60 is deposited adjacent to low melting point material 56 in a semi-additive process. It is desirable to deposit electrically conducting layer 60 alongside low melting point layer 56 in a manner that does not melt layer 56. In one embodiment, electrically conducting layer 60 is deposited on dielectric layer 50 adjacent to material 56 at a temperature of less than about 70 degrees Celsius.

Figure 7:
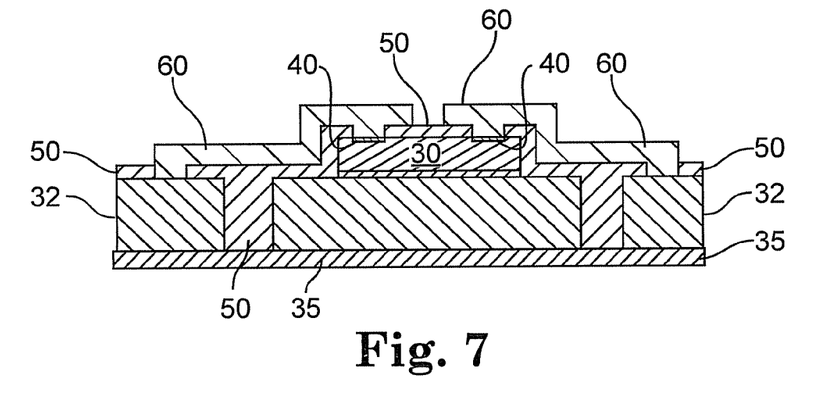
FIG. 7 is a cross-sectional view of the semiconductor device intermediate illustrated in FIG. 6 after removal of the additional low melting point material which leaves behind the conductive trace of the redistribution layer according to one embodiment.

FIG. 7 is a cross-sectional view of low melting point material 56 (FIG. 6) removed to provide a redistribution layer 60 of conducting material. In one embodiment, redistribution layer 60 is electrically separated between contacts 40 of chip 30 by dielectric material 50 after material 56 is removed. Low melting point material 56, described above, has been employed to structure layers 50 and 60 above carrier 32 to define a Z-direction topography having a thickness between about 20-200 micrometers.

Figure 8:
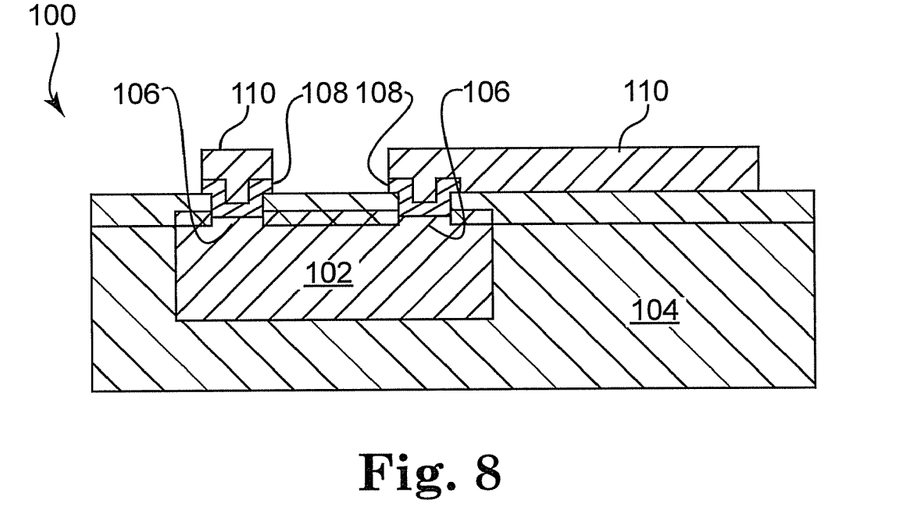
FIG. 8 is a cross-sectional view of an embedded wafer level semiconductor device including a chip embedded in encapsulation material and including a redistribution layer electrically connected to contacts of the chip.

FIG. 8 is a cross-sectional view of one embedded semiconductor device 100 according to one embodiment. Embedded device 100 includes a redistribution layer 110 that configures device 100 for e.g ball grid attachment to circuit boards and other electronic devices. Thus, in one embodiment device 100 provides an embedded wafer level ball grid array (eWLB).

The device 100 includes at least one chip 102 embedded in an encapsulation material 104, where chip 102 includes contacts 106, conductors 108 electrically connected to contacts 106, and redistribution layer 110 providing interconnection for the package to chip 102.

FIGS. 9-19 provide multiple cross-sectional views of embodiments of the fabrication of such embedded semiconductor devices 100.

Figure 9:
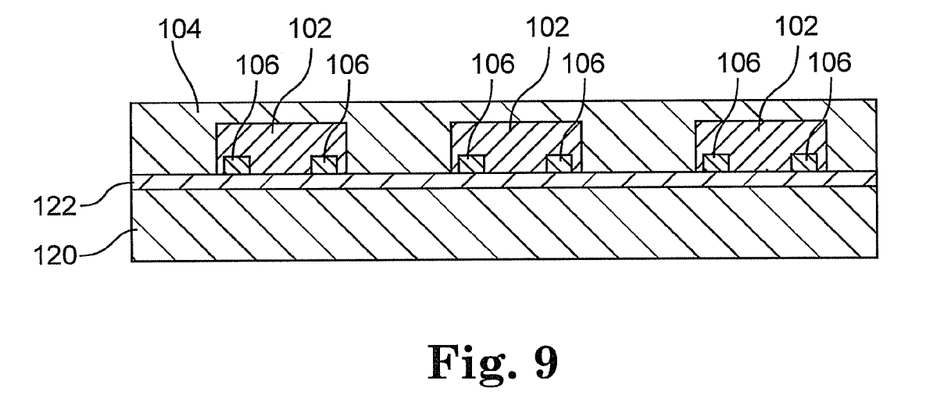
FIGS. 9-19 provide multiple schematic cross-sectional views of embodiments of the fabrication of an embedded wafer level semiconductor device.

FIG. 9 is a schematic cross-sectional view of multiple chips 102 encapsulated within encapsulation material 104 and attached to a carrier 120 along interface 122. In one embodiment, carrier 120 is provided as a reusable carrier and interface 122 is an adhesive interface configured to attach embedded chips 102 to carrier 120. In one embodiment, several dozen embedded chips 102 are attached to carrier 120 in the form of, for example, a 200 mm wafer. Other sizes, such as 300 mm or any rectangular shape are also acceptable.

Eventually, chips 102 and encapsulation material 104 are separated from carrier 120 and adhesive 122 for subsequent processing.

Figure 10:
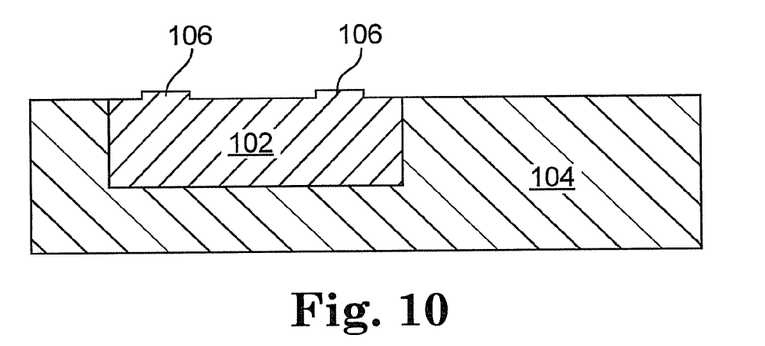

FIG. 10 is a schematic cross-sectional view of one chip 102 encapsulated in an encapsulation material 104. Chips 102 (one shown) and encapsulation material 104 have been turned such that contacts 106 are up. It is to be understood that the view of FIG. 10 illustrates only one chip 102, but many multiple such chips 102 are oriented laterally and concurrently processed in the illustrations of FIGS. 9-19. The chip 102 might represent also any multi chip arrangement including discrete passive etc as described with device 34 above.

Figure 11:
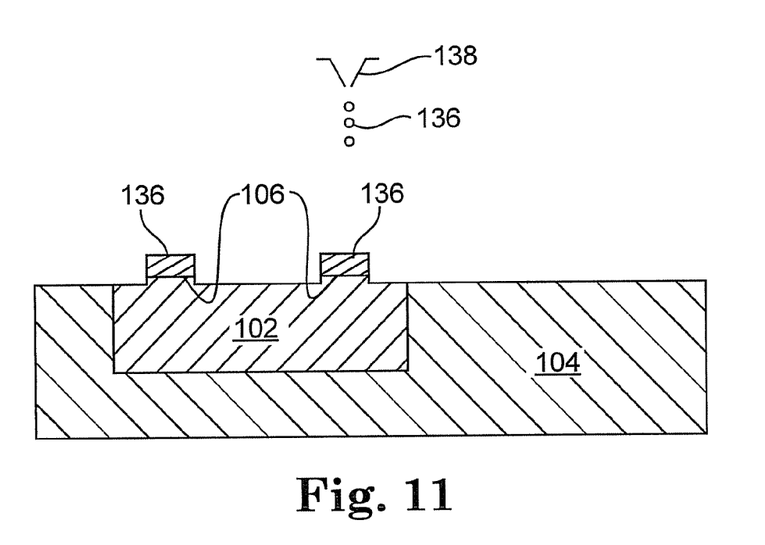

FIG. 11 is a schematic cross-sectional view of a low melting point material 136 deposited on contacts 106 according to one embodiment. In one embodiment, low melting point material 136 (material 136) is jet printed from a print head 138 in a controlled manner that deposits material 136 accurately over contacts 106. Similar to embodiments described above, in one embodiment print head 138 delivers small amounts (such as Pico-liters) of material 136 onto contacts 106. The heated material 136 solidifies upon touching contacts 106 and is deposited with high lateral accuracy. Other processes for depositing material 136 on contacts 106 are also acceptable, including printing, screen printing, spraying or other deposition processes. Material 136 is similar to the low melting point material 36 described above.

Figure 12:
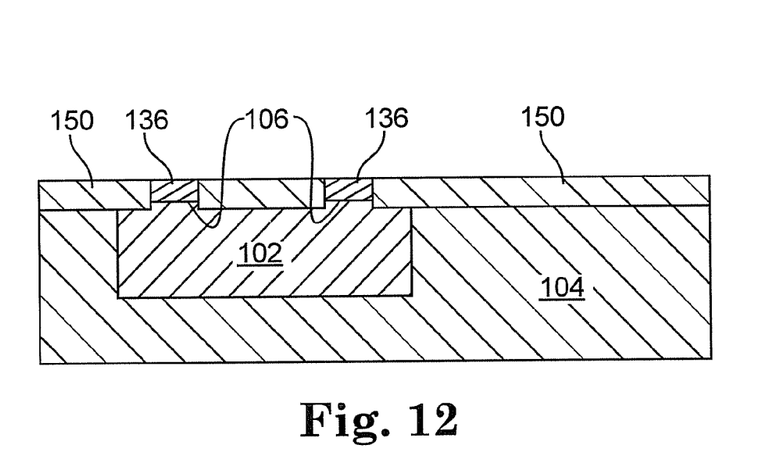

FIG. 12 is a schematic cross-sectional view of a dielectric layer 150 deposited over portions of chip 102 and encapsulation material 104. Dielectric material 150 is deposited alongside material 136 and not over material 136. A dielectric layer 150 is similar to dielectric layer 50 described above.

Figure 13:
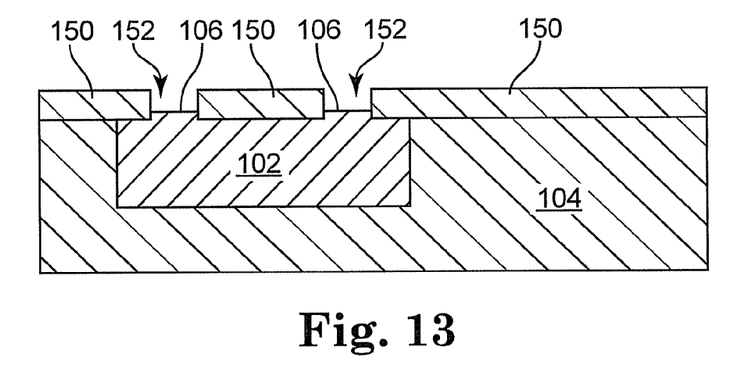

FIG. 13 is a schematic cross-sectional view of vias 152 formed to communicate through dielectric layer 150. In one embodiment, material 136 (FIG. 12) is removed to define vias 152 extending through dielectric layer 150 to open contacts 106. In one embodiment, material 136 is removed by heating material 136 above 90 degrees Celsius, melting material 136, and removing material 136 to open vias 152. Removal of material 136 opens vias 152 and exposes contacts 106, and in one embodiment leaves a trace or residue of molecules of material 136 on the walls of vias 152. The residue of material 136 is detectable through the use of analytical equipment, such as a chromatograph.

Figure 14:
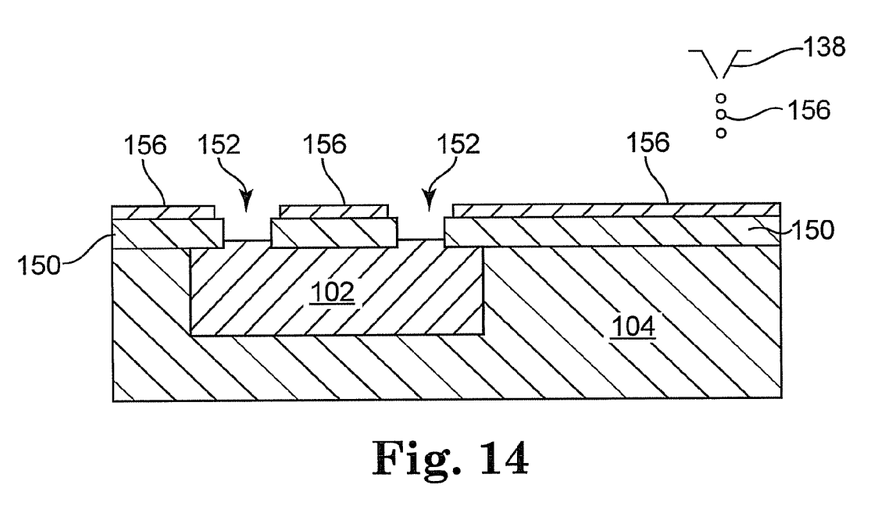

FIG. 14 is a schematic cross-sectional view of another low melting point material 156 (material 156) deposited over dielectric layer 150 and around vias 152. In one embodiment, material 156 is accurately deposited over dielectric layer 150, laterally proximate but not into vias 152. In one embodiment locations of electrical routing lines (not depicted) corresponding with the pads 106 are not coated with low melting point material 156

Figure 15:
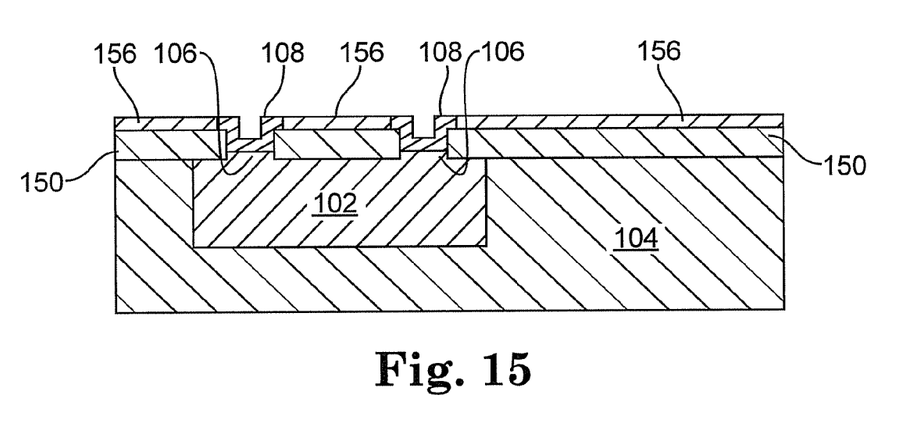

FIG. 15 is a schematic cross-sectional view of conductors 108 deposited into vias 152 (FIG. 14) and routing lines (not depicted) and electrically connected to contacts 106. In one embodiment, conductors 108 are deposited on contacts 106 in a low-temperature process of less than about 90 degrees Celsius. Suitable low-temperature processes include ink jet printing metallic or metallized conductors 108, screen printing conductors 108 or electroplating conductors 108 over contacts 106, the analog of which is described above in FIG. 6.

Figure 16:
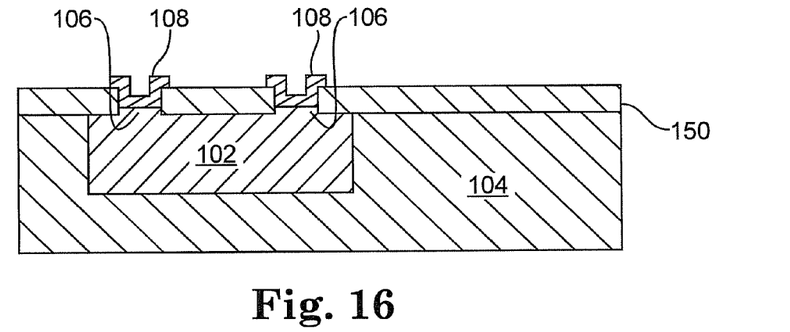

FIG. 16 is a schematic cross-sectional view of conductors 108 electrically connected to contacts 106 after removal of low melting point material 156 (FIG. 15). In one embodiment, material 156 melts at a temperature of less than 90 degrees Celsius and is removed by heating at least the region near dielectric layer 150 to a temperature above approximately 90 degrees Celsius to melt and remove material 156. After removal of material 156, conductors 108 and (not depicted) routing lines are disposed on an upper portion of dielectric layer 150 and electrically connected to contacts 106.

Figure 17:
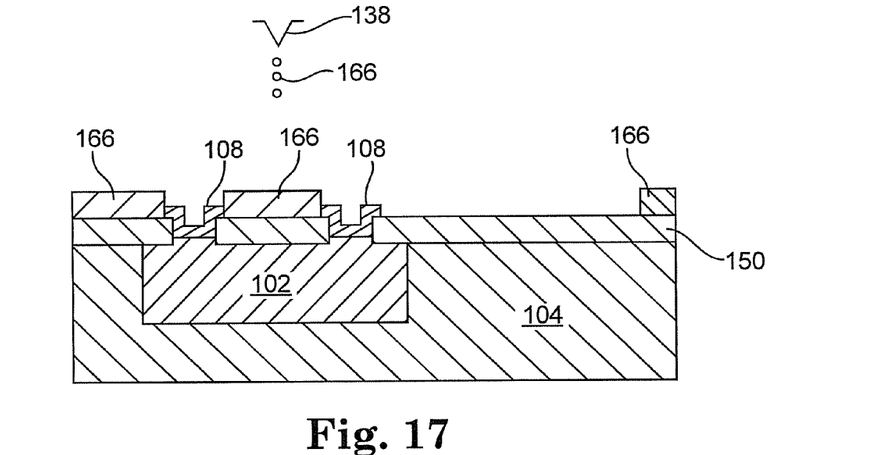

FIG. 17 is a schematic cross-sectional view of the deposition of another low melting point material 166 (material 166) onto portions of dielectric layer 150. In one embodiment, material 166 is jet printed onto dielectric layer 150 between conductors 108 and at lateral positions left and right relative to chip 102. Material 166 is similar to material 36 described above. Other suitable deposition processes for material 166 are also acceptable, including spraying or screen printing.

Figure 18:
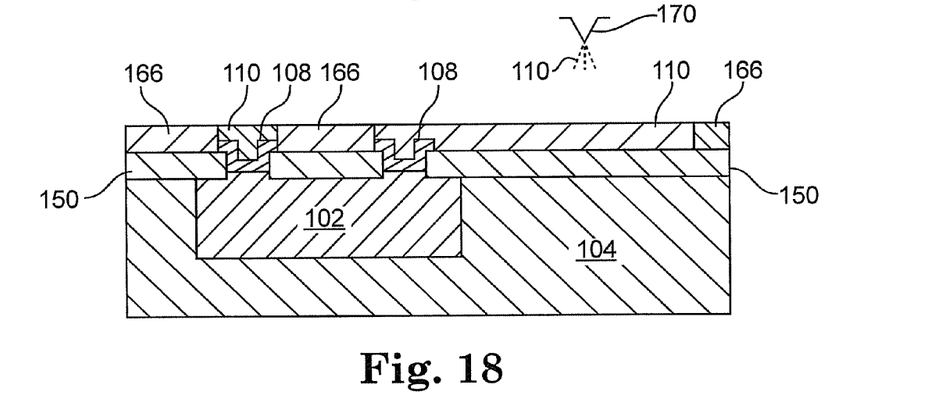

FIG. 18 is a schematic cross-sectional view of the deposition of a conductive redistribution layer 110 over portions of dielectric layer 150 between material 166. In one embodiment, conductive redistribution layer 110 (RDL 110) is deposited on portions of dielectric layer 150 in a low-temperature process of less than about 90 degrees Celsius. One suitable low-temperature process for depositing RDL 110 includes selectively and accurately screen printing or ink jet printing conductive materials between material 166.

Figure 19:
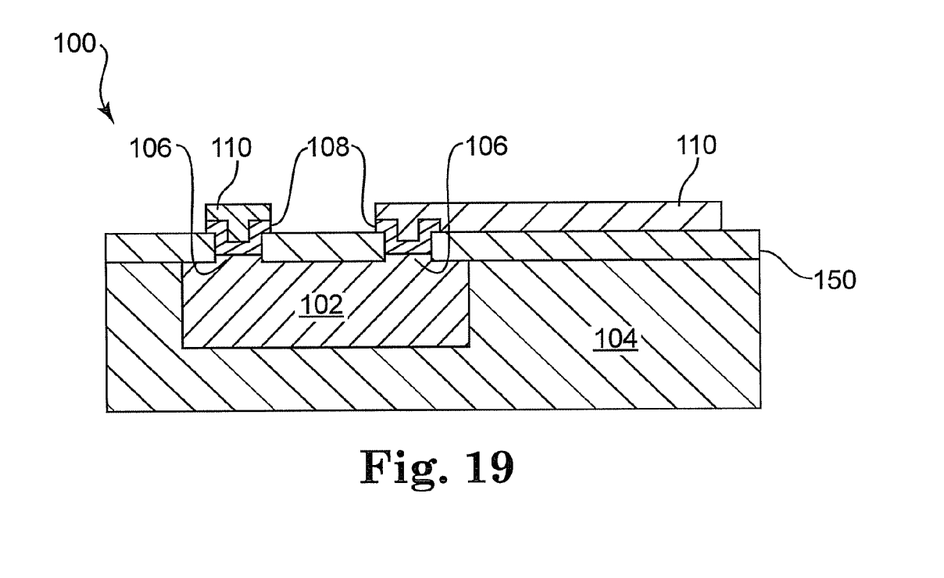

FIG. 19 is a schematic cross-sectional view of semiconductor device 100 after removal of material 166. In one embodiment, material 166 is removed (for example by melting) to reveal RDL 110 electrically connected to conductors 108, which are electrically connected to contacts 106.

Embodiments described herein provide a method of fabricating a semiconductor device having the advantages of: no bonding wires or solder clips are employed; lower Ohm resistance with improved thermal heat transfer from the chip surface away from the top side metal; double-sided cooling of the device; higher line density than is possible with heavy wires on power devices; fewer parasitics, especially inductance parasites, which enables higher switching speeds; lower profile semiconductor packages (no wire looping); reduced process costs; flexible placement of external contacts independent of chip design and pad location; precise location of vias due to accurate placement of low melting point material; ability to react to substrate shrinkage/movement by computing new bitmap patterns for deposition of the low-melting point material employing actual measured dimensions sensed by the pattern recognition system; and tool-less production between file creation, prototyping, and production of semiconductor devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of semiconductor chips and devices discussed herein. Therefore, it is intended that this invention be limited only by the claims and the equivalents thereof.

What is claimed is:

1. A method of fabricating a semiconductor device, the method comprising:
   depositing a mask of low melting point material on a surface of the semiconductor device;
   depositing a layer to be structured relative to the mask; and
   removing the mask of low melting point material.

2. The method of claim 1, comprising spraying the mask of low melting point material on the surface of the semiconductor device.

3. The method of claim 1, comprising printing the mask of low melting point material on the surface of the semiconductor device.

4. The method of claim 3, comprising screen printing the mask of low melting point material on the surface of the semiconductor device.

5. The method of claim 3, comprising jet printing the mask of low melting point material on the surface of the semiconductor device.

6. The method of claim 5, wherein the mask of low melting point material comprises one of a wax mask and a thermoplastic mask.

7. The method of claim 1, wherein the mask of low melting point material comprises a melting point between approximately 70-110 degrees Celsius.

8. A method of fabricating a semiconductor device, the method comprising:
   providing a chip attached to a leadframe;
   depositing a mask comprising low melting point material on a contact pad of the chip and on a contact area of the leadframe;
   depositing a dielectric layer to be structured relative to the mask; and
   removing the mask of low melting point material to form at least one via communicating through the dielectric layer with the contact pad of the chip.

9. The method of claim 8, comprising selectively depositing the dielectric layer to be structured between a first mask portion on the contact pad of the chip and a second mask portion on the contact area of the leadframe.

10. The method of claim 8, comprising melting the mask of low melting point material to form a first via communicating through the dielectric layer with the contact pad of the chip and a second via communicating through the dielectric layer with the contact area of the leadframe.

11. The method of claim 10, further comprising:
    depositing electrically conductive material into the first via and the second via.

12. A method of fabricating a semiconductor device, the method comprising:
    providing multiple chips embedded in an encapsulation body;
    depositing a first mask of low melting point material on a contact pad of each of the multiple chips;
    selectively depositing a dielectric layer to be structured relative to the first mask; and
    removing the first mask to form at least one via communicating through the dielectric layer with the contact pad of each of the multiple chips.

13. The method of claim 12, further comprising:
    depositing a second mask of low melting point material on the dielectric layer.

14. The method of claim 13, comprising depositing a conducting layer to be structured relative to the second mask, and removing the second mask to structure the conducting layer into a redistribution layer in electrical communication with the contact pad of each of the multiple chips.

15. The method of claim 14, comprising depositing the conducting layer into the at least one via communicating through the dielectric layer with the contact pad of each of the multiple chips.

16. The method of claim 12, further comprising:
curing the dielectric layer at a curing temperature of less than approximately 90 degrees Celsius.

17. A method of fabricating a semiconductor device, the method comprising:
attaching a chip to a carrier;
printing a low-melting point material on at least a portion of the chip;
depositing a dielectric material over the chip and the carrier around the low-melting point material; and
removing the low-melting point material to open a via through the dielectric material communicating with the chip.

18. The method of claim 17, wherein the chip comprises an active surface comprising a contact and a second surface opposite the active surface, the second surface attached to an upper surface of an electrically conductive leadframe, the low-melting point material printed on the contact and on the upper surface of the electrically conductive leadframe.

19. The method of claim 17, further comprising:
forming an electrical trace communicating with the chip by depositing electrically conducting material into the via.

20. The method of claim 17, wherein printing a low-melting point material comprises ink jet printing a material having a melting point of between approximately 70-110 degrees Celsius.

21. The method of claim 17, further comprising:
pre-curing the dielectric material at a temperature of less than 70 degrees Celsius with ultraviolet light.

22. The method of claim 17, further comprising:
post-curing the dielectric material with the via at a temperature of greater than 90 degrees Celsius.

* * * * *